(12) United States Patent
Kimura

(10) Patent No.: US 10,295,617 B2
(45) Date of Patent: May 21, 2019

(54) DISTRIBUTION ANALYZING DEVICE AND DISTRIBUTION ANALYZING METHOD

(71) Applicant: Kenjiro Kimura, Hyogo (JP)

(72) Inventor: Kenjiro Kimura, Hyogo (JP)

(73) Assignee: Kenjiro Kimura, Hyogo (JP)

( * ) Notice: Subject to any disclaimer, the term of this patent is extended or adjusted under 35 U.S.C. 154(b) by 71 days.

(21) Appl. No.: 14/770,113

(22) PCT Filed: Feb. 13, 2014

(86) PCT No.: PCT/JP2014/000743
§ 371 (c)(1),
(2) Date: Aug. 25, 2015

(87) PCT Pub. No.: WO2014/129151
PCT Pub. Date: Aug. 28, 2014

(65) Prior Publication Data
US 2016/0018484 A1    Jan. 21, 2016

(30) Foreign Application Priority Data
Feb. 25, 2013    (JP) ................................ 2013-035177

(51) Int. Cl.
*G01R 33/10*    (2006.01)
(52) U.S. Cl.
CPC .................................... *G01R 33/10* (2013.01)
(58) Field of Classification Search
CPC ......... G01R 33/10; G01R 33/12; G01R 29/14
(Continued)

(56) References Cited

U.S. PATENT DOCUMENTS

| 6,075,437 A | 6/2000 | Heremans et al. |
| 6,887,365 B2 | 5/2005 | Naughton |

(Continued)

FOREIGN PATENT DOCUMENTS

| CN | 101542229 | 9/2009 |
| EP | 2 325 667 | 5/2011 |

(Continued)

OTHER PUBLICATIONS

International Search Report dated May 13, 2014 in International Application No. PCT/JP2014/000743.
(Continued)

*Primary Examiner* — Christine A Enad
(74) *Attorney, Agent, or Firm* — Wenderoth, Lind & Ponack, L.L.P.

(57) ABSTRACT

A distribution analyzing device (20) includes: an obtaining unit (21) which obtains measurement data of a field measured, through a sensor sensing area, independently at each of rotation angles and at each of grid coordinate positions of the sensor sensing area; and a calculation unit (22) which calculates a distribution of the field from the measurement data, using an arithmetic expression obtained by deriving a target harmonic function, which indicates the distribution of the field, using a condition that a convolution of the target harmonic function and a shape function, which indicates a shape of a cross section of the finite sensor sensing area along a plane parallel to the measurement plane, is equal to a provisional harmonic function derived by solving the Laplace equation using the measurement data and a size of the sensor sensing area in a direction perpendicular to the measurement plane.

11 Claims, 7 Drawing Sheets

(58) Field of Classification Search
USPC .......................................................... 702/57
See application file for complete search history.

(56) References Cited

U.S. PATENT DOCUMENTS

| | | | |
|---|---|---|---|
| 7,214,303 B2 | 5/2007 | Naughton | |
| 7,462,270 B2 | 12/2008 | Naughton | |
| 8,280,690 B2 | 10/2012 | Sobel | |
| 8,536,862 B2 * | 9/2013 | Kimura | B82Y 35/00 324/244 |
| 9,568,567 B2 * | 2/2017 | Kimura | G01R 33/12 |
| 2004/0113621 A1 | 6/2004 | Naughton | |
| 2005/0241375 A1 | 11/2005 | Naughton | |
| 2007/0030959 A1 * | 2/2007 | Ritter | A61B 6/583 378/207 |
| 2007/0235340 A1 | 10/2007 | Naughton | |
| 2009/0230951 A1 | 9/2009 | Sobel | |
| 2009/0232951 A1 * | 9/2009 | Varanasi | A23G 3/0023 426/283 |
| 2010/0219819 A1 * | 9/2010 | Kimura | B82Y 35/00 324/244 |
| 2012/0330581 A1 | 12/2012 | Kimura | |
| 2014/0081584 A1 * | 3/2014 | Kimura | G01R 33/12 702/57 |
| 2014/0232393 A1 * | 8/2014 | Wheaton | G01R 33/24 324/309 |

FOREIGN PATENT DOCUMENTS

| | | | | |
|---|---|---|---|---|
| EP | 2960668 B1 * | 5/2018 | | |
| JP | 63-210790 | 9/1988 | | |
| JP | 11-317555 | 11/1999 | | |
| JP | 2006-501484 | 1/2006 | | |
| JP | 2007-271465 | 10/2007 | | |
| JP | 2010-78435 | 4/2010 | | |
| JP | WO 2012153496 A1 * | 11/2012 | ............. | G01R 33/12 |
| WO | 2004/038430 | 5/2004 | | |
| WO | 2008/123432 | 10/2008 | | |
| WO | 2011/108543 | 9/2011 | | |
| WO | 2012/153496 | 11/2012 | | |

OTHER PUBLICATIONS

Shinichi Yamakawa et al., "A Nano-resolution Method for Magnetic-field Reconstruction Using a Thin-film Magnetic Sensor", Transactions of the Society of Instrument and Control Engineers, vol. 42, No. 6, pp. 597-602, Jun. 2006 with English abstract.

Kenjiro Kimura et al., "Development of High-resolution Magnetic Imaging Method with Tunneling Magnetoresistance Device to Inspect Reinforcing Steels Inside a Concrete Building", Journal of JSNDI vol. 62, No. 10, pp. 527-528, Oct. 2013 with partial English translation.

Extended European Search Report dated Jan. 16, 2017 in corresponding European patent application No. 14 753 850.8.

Office Action issued Mar. 22, 2017 in corresponding Chinese Application No. 201480010105.3, with English translation of the Search Report.

* cited by examiner

DISTRIBUTION ANALYZING DEVICE AND DISTRIBUTION ANALYZING METHOD

TECHNICAL FIELD

The present invention relates to a distribution analyzing device and a distribution analyzing method for analyzing a field having a property satisfying the Laplace equation.

BACKGROUND ART

Conventionally, a spatial distribution of a magnetic field (hereafter, also referred to as a "magnetic field distribution") is utilized in various applications such as locating an abnormal electric current path in an electronic component and examining a disease part of a human body. A superconducting quantum interference device and a magnetoresistive sensor, for instance, are used as magnetic field sensors to measure such a magnetic field distribution. The superconducting quantum interference device is also referred to as a "SQUID element".

Magnetic force microscopy (MFM) may also be used to obtain a magnetic field distribution. A magnetic field sensor which includes a sharpened silicon tip coated with a magnetic thin film is used for a MFM probe. Such a probe is also referred to as a "magnetic probe". Patent Literature (PTL) 1 proposes a structure in which a carbon nanotube magnetic probe is used as a MFM probe. PTL 2 describes a method for measuring a three-dimensional distribution of, for instance, a magnetic field and an electric field in a three-dimensional space.

In the method described in PTL 2, the Laplace equation which is a fundamental equation of a static magnetic field is exactly solved using, as a boundary condition, a two-dimensional magnetic field distribution and a two-dimensional distribution of the gradient of the magnetic field obtained at a specific measurement plane, thus obtaining a three-dimensional magnetic field distribution in a space around the measurement plane. The gradient of the magnetic field mentioned here means a gradient of a magnetic field in a direction normal to the measurement plane. The space around the measurement plane includes both a three-dimensional space above the measurement plane and a three-dimensional space below the measurement plane.

With method described in PTL 2, a structure of a source of a magnetic field (magnetic field source) can be imaged using measurement data of a magnetic field distribution obtained in an area away from the magnetic field source. The image showing the structure of the magnetic field source can be utilized for medical diagnosis and electronic component failure analysis, for example.

When a magnetic field source in the space below a measurement plane is measured, an electronic circuit and a mechanical component for processing signals from a magnetic field sensor are typically present in the space above the measurement plane. These are not objects to be measured, but are the magnetic field sources. The method described in PTL 2 allows the distribution of a field to be precisely analyzed even when magnetic field sources are included in both of the spaces above and below the measurement plane.

The spatial resolution in the measurement of a magnetic field distribution depends on the size of a coil used in a SQUID element or the size of a magnetoresistive sensor. Miniaturizing such a magnetic field sensor allows the magnetic field distribution to be imaged with a higher spatial resolution. There is, however, actually a limit to the miniaturization of the magnetic field sensor. For example, it is hard to manufacture a magnetic field sensor of 100 nm or less in size. Besides, a miniaturized magnetic field sensor outputs a small electric signal from a sensor sensing area thereof, and suffers a low signal to noise ratio (S/N).

To address this, a method of rotating a magnetic field sensor is used as described in PTLs 3, 4, and 5. For example, when an X direction and a Y direction are perpendicular to each other, if a magnetic field sensor has a size that is greater in the X direction and smaller in the Y direction, the resolution of a magnetic field distribution is lower in the X direction and higher in they direction. Consequently, the rotation of the magnetic field sensor increases the resolution of a magnetic field distribution in more directions.

CITATION LIST

Patent Literature

[PTL 1] Japanese translation of PCT International Application Publication No. 2006-501484
[PTL 6] WO 2008/123432
[PTL 3] Japanese Unexamined Patent Application Publication No. 2007-271465
[PTL 4] WO 2011/108543
[PTL 5] WO 2012/153496

SUMMARY OF INVENTION

Technical Problem

However, a measurement area where a magnetic field is measured has various sizes. With the method in which a magnetic field sensor is rotated, a distribution of a magnetic field is analyzed, assuming that the long side of the magnetic field sensor is greater in size than a magnetic field source. Accordingly, the magnetic field sensor preferably has a sufficiently large size. On the contrary, measuring a magnetic field from a small magnetic field source with an excessively large magnetic field sensor is inefficient from the viewpoint of signal processing.

Accordingly, a method is employed with which a magnetic field is measured repeatedly with a small magnetic field sensor while the position of the magnetic field sensor is kept changing, thus obtaining data equivalent to that obtained when the magnetic field is measured with a large magnetic field sensor. This allows even a small magnetic field sensor to measure magnetic fields from magnetic field sources of various sizes. It takes a long time to obtain, using a small magnetic field sensor, data equivalent to that obtained by measuring a magnetic field with a large magnetic field sensor.

In view of this, an object of the present invention is to provide a distribution analyzing device and a distribution analyzing method for analyzing a distribution of a field at high speed.

Solution to Problem

In order to address the above problem, a distribution analyzing device according to the present invention is a distribution analyzing device for analyzing a distribution of a field having a property satisfying a Laplace equation, the distribution analyzing device including: an obtaining unit configured to obtain measurement data of the field measured, through a sensor sensing area, independently at each of rotation angles of the sensor sensing area and at each of grid coordinate positions of the sensor sensing area on a measurement plane where the field is measured, the sensor sensing area being (i) a finite area which relatively rotates about an axis perpendicular to the measurement plane, (ii) an area which relatively moves such that a predetermined position in the area is brought to each of the grid coordinate positions in a state where the area has relatively rotated, and (iii) an area in which the field is sensed as an aggregate; and a calculation unit configured to calculate the distribution of the field from the measurement data of the field, using an arithmetic expression obtained by deriving a target harmonic function, which indicates the distribution of the field, using a condition that a convolution of the target harmonic function and a shape function, which indicates a shape of a cross section of the finite sensor sensing area along a plane parallel to the measurement plane, is equal to a provisional harmonic function derived by solving the Laplace equation using the measurement data of the field and a size of the sensor sensing area in a direction perpendicular to the measurement plane.

Accordingly, error (noise) according to the shape of the sensor sensing area is eliminated from the measurement data of the field measured at each rotation angle and at each coordinate position. Accordingly, the distribution analyzing device can appropriately analyze the distribution using both the rotation angle and the coordinate position of the sensor sensing area. In other words, the distribution can be analyzed at high speed, using both the rotation angle and the coordinate position even if the sensor sensing area is small.

The field may be a magnetic field or an electric field, the obtaining unit may be configured to obtain the measurement data of the field, and the calculation unit may be configured to calculate the distribution of the field from the measurement data of the field.

Accordingly, the distribution analyzing device can analyze a spatial distribution of, for instance, a magnetic field with high accuracy. The analyzed spatial distribution can be utilized for various types of application, such as electronic component failure analysis, medical diagnosis, and concrete rebar corrosion inspection.

The arithmetic expression used by the calculation unit to calculate the distribution of the field from the measurement data of the field may include multiplication of the shape function and the provisional harmonic function each subjected to Fourier transform.

Accordingly, information on the shape of the sensor sensing area is appropriately reflected in the calculation of the distribution of the field. Consequently, error according to the shape of the sensor sensing area is eliminated appropriately.

The arithmetic expression used by the calculation unit to calculate the distribution of the field from the measurement data of the field may include integration of, over the rotation angles, an expression including multiplication of the shape function and the provisional harmonic function each subjected to a Fourier transform.

Accordingly, information obtained at each rotation angle is appropriately reflected in the calculation of the distribution of the field. This allows calculation of the distribution with high precision.

The arithmetic expression used by the calculation unit to calculate the distribution of the field from the measurement data of the field may include division of an expression obtained by integrating, over the rotation angles, an expression including multiplication of the shape function and the provisional harmonic function, by an expression obtained by integrating, over the rotation angles, an expression including a square of an absolute value of the shape function, the shape function and the provisional harmonic function each having been subjected to a Fourier transform.

Accordingly, information on the shape of the sensor sensing area and information obtained at each rotation angle are reflected in the calculation of the distribution of the field at appropriate proportion. This allows calculation of more appropriate distribution.

The obtaining unit may obtain the measurement data which is obtained through the sensor sensing area, which is caused to relatively rotate by the field rotating about the axis perpendicular to the measurement plane, and which moves to each of the grid coordinate positions that are stationary on the measurement plane.

In this manner, for example, the distribution analyzing device can obtain measurement data from a measurement device which includes a sensor sensing area which moves in a parallel manner, and a rotary sample stage which rotates, having thereon an inspection object.

When (x, y, z) denotes a rotating coordinate system which rotates, (X, Y, Z) denotes a stationary coordinate system which does not rotate, $\theta$ denotes one of the rotation angles, $k_x$ denotes a wavenumber of the rotating coordinate system in an x direction, $k_y$ denotes a wavenumber of the rotating coordinate system in a y direction, $\xi$ denotes a wavenumber of the stationary coordinate system in an X direction, $\eta$ denotes a wavenumber of the stationary coordinate system in a Y direction, $$\tilde{f}(\xi,\eta) \quad \text{[Math. 1]}$$

denotes the shape function, and $$\tilde{\phi}_\theta(\xi,\eta,z) \quad \text{[Math. 2]}$$

denotes the provisional harmonic function, the shape function and the provisional harmonic function each having been subjected to a two-dimensional Fourier transform, the arithmetic expression used by the calculation unit to calculate the distribution of the field from the measurement data of the field may be $$\frac{\int \tilde{f}(k_x\cos\theta - k_y\sin\theta, k_x\sin\theta + k_y\cos\theta)\tilde{\phi}_0(k_x\cos\theta - k_y\sin\theta, k_x\sin\theta + k_y\cos\theta, z)d\theta}{\int |\tilde{f}(k_x\cos\theta - k_y\sin\theta, k_x\sin\theta + k_y\cos\theta)|^2 d\theta}. \quad \text{[Math. 3]}$$

Accordingly, the distribution analyzing device can eliminate error according to the shape of the sensor sensing area and calculate the distribution of the field:

When (x, y, z) denotes a rotating coordinate system which rotates, (X, Y, Z) denotes a stationary coordinate system which does not rotate, $\theta$ denotes one of the rotation angles, $k_x$ denotes a wavenumber of the rotating coordinate system in an x direction, $k_y$ denotes a wavenumber of the rotating coordinate system in a y direction, $\xi$ denotes a wavenumber of the stationary coordinate system in an X direction, $\eta$ denotes a wavenumber of the stationary coordinate system in a Y direction, $$\tilde{f}(\xi,\eta) \quad \text{[Math. 4]}$$

denotes the shape function, and $$\tilde{\phi}_\theta(\xi,\eta,z) \quad \text{[Math. 5]}$$

denotes the provisional harmonic function, the shape function and the provisional harmonic function each having been subjected to a two-dimensional Fourier transform, the arithmetic expression used by the calculation unit to calculate the distribution of the field from the measurement data of the field may be $$-\frac{\int \tilde{f}(k_x\cos\theta - k_y\sin\theta, k_x\sin\theta + k_y\cos\theta)\tilde{\phi}_0(k_x\cos\theta - k_y\sin\theta, k_x\sin\theta + k_y\cos\theta, z)\sin\theta d\theta}{\int |\tilde{f}(k_x\cos\theta - k_y\sin\theta, k_x\sin\theta + k_y\cos\theta)|^2 \sin^2\theta d\theta}.$$ [Math. 6]

which is for calculating a component of the field in the x direction.

Accordingly, the distribution analyzing device can eliminate error according to the shape of the sensor sensing area, and calculate a distribution of components of the field in the x direction.

When (x, y, z) denotes a rotating coordinate system which rotates, (X, Y, Z) denotes a stationary coordinate system which does not rotate, θ denotes one of the rotation angles, $k_x$ denotes a wavenumber of the rotating coordinate system in an x direction, $k_y$ denotes a wavenumber of the rotating coordinate system in a y direction, ξ denotes a wavenumber of the stationary coordinate system in an X direction, η denotes a wavenumber of the stationary coordinate system in a Y direction, $$\tilde{f}(\xi,\eta)$$ [Math. 7]

denotes the shape function, and $$\tilde{\phi}_0(\xi,\eta,z)$$ [Math. 8]

denotes the provisional harmonic function, the shape function and the provisional harmonic function each having been subjected to a two-dimensional Fourier transform, the arithmetic expression used by the calculation unit to calculate the distribution of the field from the measurement data of the field may be $$\frac{\int \tilde{f}(k_x\cos\theta - k_y\sin\theta, k_x\sin\theta + k_y\cos\theta)\tilde{\phi}_0(k_x\cos\theta - k_y\sin\theta, k_x\sin\theta + k_y\cos\theta, z)\cos\theta d\theta}{\int |\tilde{f}(k_x\cos\theta - k_y\sin\theta, k_x\sin\theta + k_y\cos\theta)|^2 \cos^2\theta d\theta}$$ [Math. 9]

which is for calculating a component of the field in the y direction,

Accordingly, the distribution analyzing device can eliminate error according to the shape of the sensor sensing area, and calculate a distribution of components of the field in the y direction.

The distribution analyzing device may further include a measurement unit which includes the sensor sensing area, wherein the measurement unit may be configured to measure the field, through the sensor sensing area, independently at each of the rotation angles of the sensor sensing area and at each of the grid coordinate positions of the sensor sensing area, and the obtaining unit may be configured to obtain the measurement data of the field measured by the measurement unit.

Accordingly, the distribution analyzing device can directly measure the field without relying on another device. Thus, the distribution analyzing device can calculate the distribution of the field, based on the measurement data of the field measured.

The distribution analyzing device may further include an image processing unit configured to generate an image which shows the distribution, using the distribution calculated by the calculation unit.

Accordingly, the distribution analyzing device can generate an image having no error according to the shape of the sensor sensing area, since the error has been eliminated.

The obtaining unit may obtain the measurement data of the field measured through the sensor sensing area which relatively moves such that a central position of the sensor sensing area is brought to each of the grid coordinate positions in the state where the sensor sensing area has relatively rotated, and the calculation unit may calculate the distribution of the field from the measurement data of the field, using the arithmetic expression obtained by deriving the target harmonic function which satisfies that a convolution of the target harmonic function and the shape function is equal to the provisional harmonic function, the shape function being defined using the central position of the sensor sensing area as a reference point.

This makes the shape function less complicated. Accordingly, the distribution analyzing device can inhibit an increase in the amount of calculation.

The calculation unit may be configured to calculate the distribution of the field from the measurement data of the field, using the arithmetic expression obtained by deriving the target harmonic function using the condition that the convolution of the target harmonic function and the shape function is equal to the provisional harmonic function obtained by solving, the Laplace equation using a boundary condition that an integral of a solution of the Laplace equation over an interval corresponding to the size of the sensor sensing area in the direction perpendicular to the measurement plane matches the measurement data of the field.

Accordingly, an appropriate provisional harmonic function is obtained based on the Laplace equation, measurement data, and the size of the sensor sensing area in the direction perpendicular to the measurement plane.

A distribution analyzing method according to the present invention may be a distribution analyzing method for analyzing a distribution of a field having a property satisfying a Laplace equation, the distribution analyzing method including: obtaining measurement data of the field measured, through a sensor sensing area, independently at each of rotation angles of the sensor sensing area and at each of grid coordinate positions of the sensor sensing area on a measurement plane where the field is measured, the sensor sensing area being (i) a finite area which relatively rotates about an axis perpendicular to the measurement plane, (ii) an area which relatively moves such that a predetermined position in the area is brought to each of the grid coordinate positions in a state where the area has relatively rotated, and (iii) an area in which the field is sensed as an aggregate; and calculating the distribution of the field from the measurement data of the field, using an arithmetic expression obtained by deriving a target harmonic function, which indicates the distribution of the field, using a condition that a convolution of the target harmonic function and a shape function, which indicates a shape of a cross section of the finite sensor sensing area along a plane parallel to the measurement plane, is equal to a provisional harmonic function derived by solving the Laplace equation using the measurement data of the field and a size of the sensor sensing area in a direction perpendicular to the measurement plane.

This achieves the distribution analyzing device according to the present invention as a distribution analyzing method for analyzing a distribution of a field.

Advantageous Effects of Invention

According to the present invention, a magnetic field distribution and an electric field distribution are analyzed at high speed even if a sensor sensing area is small.

DESCRIPTION OF EMBODIMENTS

The following describes an embodiment according to the present invention, with reference to the drawings. It should be noted that constituent elements to which the same numeral is assigned show the same constituent element or the same type of constituent elements, throughout the drawings.

The embodiments described below show preferred specific examples of the present invention. The numerical values, shapes, materials, constituent elements, the arrangement and connection of the constituent elements, steps, the processing order of the steps, and the like described in the following embodiments are mere examples, and thus are not intended to limit the scope of the claims. Thus, among the constituent elements in the following embodiments, constituent elements not recited in any of the independent claims defining the most generic part of the inventive concept of the present invention are described as arbitrary constituent elements included in more desirable embodiments.

Embodiment 1

Figure 1:
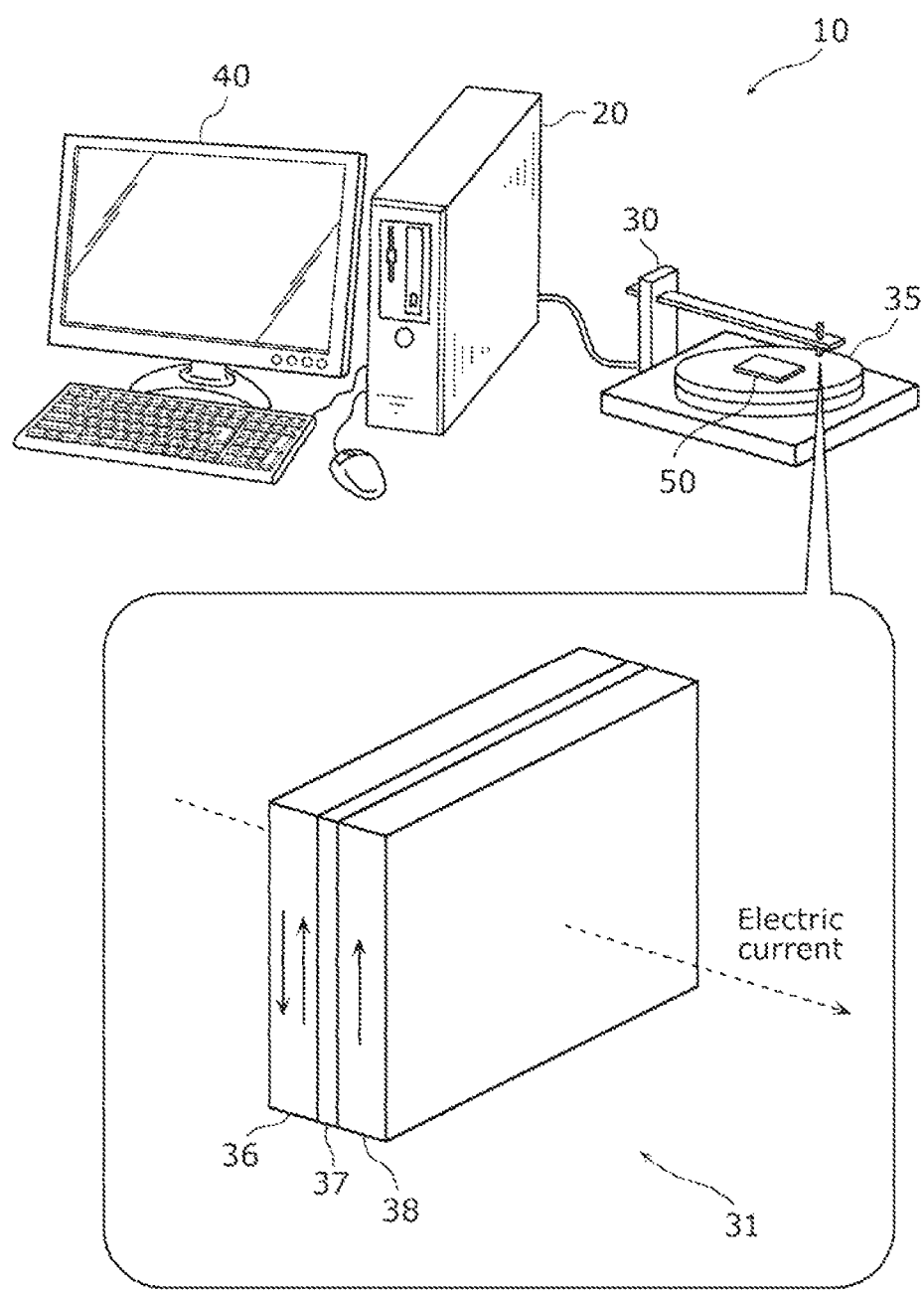
FIG. 1 is a schematic diagram of a distribution analyzing system according to Embodiment 1.

FIG. 1 is a schematic diagram of a distribution analyzing system according to Embodiment 1. A distribution analyzing system 10 illustrated in FIG. 1 includes a distribution analyzing device 20, a measurement device 30, and a display device 40. The measurement device 30 measures a field to be analyzed. The distribution analyzing device 20 analyzes a distribution of the measured field. The display device 40 displays an image showing the analyzed distribution. The distribution analyzing device 20 and the display device 40 may constitute a computer system, as illustrated in FIG. 1.

Here, a field to be analyzed has a property satisfying the Laplace equation. The Laplace equation is represented by one of the equations shown in Expression 1.

[Math. 10]

$$\frac{\partial^2}{\partial x^2}F(x, y, z) + \frac{\partial^2}{\partial y^2}F(x, y, z) + \frac{\partial^2}{\partial z^2}F(x, y, z) = 0$$

$$\nabla^2 F(x, y, z) = 0$$

$$\Delta F(x, y, z) = 0$$

Expression 1

In Expression 1. F(x, y, z) is a function satisfying the Laplace equation, and is also referred to as a "harmonic function". Moreover, $\Delta$ in Expression 1 is referred to as "Laplacian".

The field having a property satisfying the Laplace equation is a magnetic field in a location where there is no electric current or spontaneous magnetization, or is an electric field in a location where there is no electric charge, for instance. The distribution analyzing device 20 analyzes a distribution of such a field. Although the present embodiment and the subsequent embodiments are described on the assumption that a field is a magnetic field, the field may not be a magnetic field so long as the field has a property satisfying the Laplace equation as mentioned above.

The measurement device 30 illustrated in FIG. 1 is a sensor device which measures a field to be analyzed. Specifically, the measurement device 30 measures a magnetic field around an inspection object 50. The measurement device 30 includes a sensor sensing area 31 which is a probe. The sensor sensing area 31 is an area for sensing a field. It should be noted that a sensor means the entire measurement device 30 and also means a part of the measurement device 30 such as the sensor sensing area 31.

In the example illustrated in FIG. 1, the sensor sensing area includes a tunneling magnetoresistive (TMR) element composed of three thin films, namely a soft layer 36, a tunneling layer 37, and a pinned layer (fixed magnetic layer) 38. The soft layer 36 includes a magnetic material whose magnetization direction varies according to the direction of the applied magnetic field. The pinned layer 38 includes a magnetic material whose magnetization direction does not vary. The tunneling layer 37 is an insulating film.

The electric resistance differs between when the soft layer 36 and the pinned layer 38 have the same magnetization direction and when the soft layer 36 and the pinned layer 38 have different magnetization directions. Such changes in electric resistance are utilized to measure the magnetic field.

The measurement device 30 measures the magnetic field in the sensor sensing area 31, using the above property. It should be noted that an element other than the TMR element, such as a SQUID element or a giant magnetoresistive (GMR) element, may be used. The measurement device 30 can measure the magnetic field at the sensor sensing area 31, even when such another element is used.

The measurement device 30 has a mechanism for moving the sensor sensing area 31. In addition, the measurement device 30 also has a mechanism for rotating a rotary sample stage 35 on which the inspection object 50 is placed. In other words, the measurement device 30 can rotate a field. Accordingly, the measurement device 30 can relatively move and rotate the sensor sensing area 31, with respect to the field.

Utilizing the above mechanism, the measurement device 30 moves, at each rotation angle, the sensor sensing area 31 to each of grid coordinate positions on a measurement plane perpendicular to a rotation axis, and measures a magnetic field through the sensor sensing area 31 at the rotation angle. Accordingly, the measurement device 30 can measure a field independently at each rotation angle and at each coordinate position. In addition, the measurement device 30 measures a perpendicular change (gradient) in the field with respect to the measurement plane, and thus also measures a magnetic field at another measurement plane in a similar manner.

It should be noted that the structure of the measurement device 30 is not limited to the above example. The measurement device 30 may have a mechanism for moving the rotary sample stage 35 in a parallel manner. In this case, in a state where the sensor sensing area 31 is stationary, the measurement device 30 rotates the rotary sample stage 35, and furthermore moves the rotary sample stage 35 in a parallel manner, thus relatively moving the sensor sensing area 31 with respect to a field.

In addition, the measurement device 30 may have a mechanism for rotating the sensor sensing area 31. Accordingly, the measurement device 30 can relatively rotates the sensor sensing area 31 with respect to a field, without rotating the rotary sample stage 35.

Figure 2:
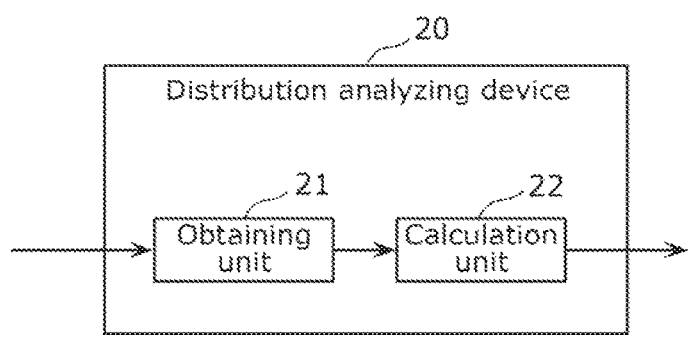
FIG. 2 is a configuration diagram of a distribution analyzing device according to Embodiment 1.

FIG. 2 is a configuration diagram of the distribution analyzing device 20 illustrated in FIG. 1. As illustrated in FIG. 2, the distribution analyzing device 2g includes an obtaining unit 21 and a calculation unit 22.

The obtaining unit 21 obtains measurement data of a field measured by the measurement device 30. The obtaining unit 21 may obtain measurement data through a communication cable or a recording medium.

The calculation unit 22 calculates a distribution of the field, from the measurement data obtained by the obtaining unit 21 using a predetermined arithmetic expression. A predetermined arithmetic expression can be obtained by deriving a target harmonic function (to be analyzed) which indicates a distribution of a field, based on a law that a convolution of the target harmonic function and a shape function indicating the shape of the sensor sensing area 31 is equal to a provisional harmonic function obtained, from the measurement data by solving the Laplace equation.

The measurement data includes error against the target harmonic function according to the shape of the sensor sensing area 31 (vagueness, noise). Thus, the provisional harmonic function obtained from measurement data also includes error. This provisional harmonic function corresponds to a convolution of the target harmonic function indicating an original distribution of a field and a shape function. Using an arithmetic expression obtained by deriving such a target harmonic function satisfying this relationship, the calculation unit 22 eliminates the error included in the provisional harmonic function, thus calculating a more accurate distribution.

In addition, the calculation unit 22 can use measurement data obtained at each rotation angle and at each coordinate position, to calculate a distribution of a field, by using an arithmetic expression based, on the shape function. Accordingly, the calculation unit 22 can calculate the distribution of the field at higher speed than when the calculation unit 22 uses measurement data obtained at each rotation angle and at each radial coordinate.

These constituent elements included in the distribution analyzing device 20 are achieved by, for example, electronic circuits such as integrated circuits. These constituent elements may form one circuit as a whole or may be different circuits. In addition, these constituent elements may be each a widely used circuit or a dedicated circuit.

Alternatively, these constituent elements may be achieved by a program. In this case, a computer (more specifically, a processor of the computer) reads and executes a program stored in a recording medium, thus achieving functionality of these constituent elements.

Figure 3:
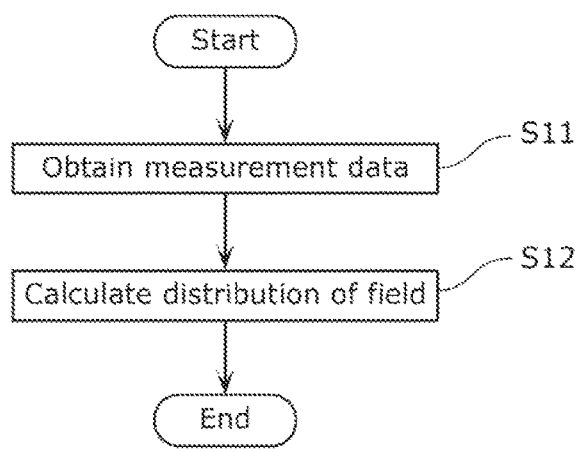
FIG. 3 is a flowchart illustrating operation of the distribution analyzing device according to Embodiment 1.

FIG. 3 is a flowchart illustrating the operation of the distribution analyzing device 20 illustrated in FIG. 2. First, the obtaining unit 21 obtains measurement data of a field measured at each rotation angle and at each coordinate position (S11). Next, the calculation unit 22 calculates, using an arithmetic expression based on a shape function, a distribution of a field from the measurement data of the field measured at each rotation angle and at each coordinate position (S12). In this manner, the distribution analyzing device 20 can calculate an accurate distribution at high speed.

The following describes in detail advantageous effects achieved by the above-described distribution analyzing system 10, with reference to FIGS. 4 to 9.

Figure 4:
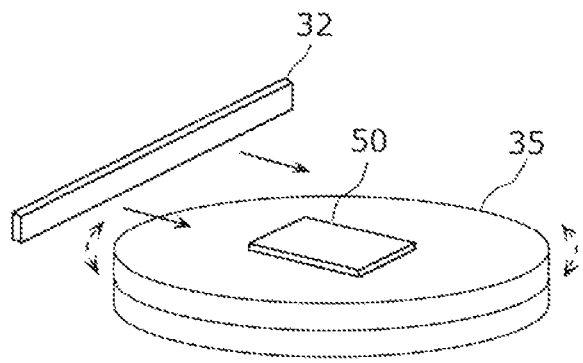
FIG. 4 is a perspective view illustrating a state where a large sensor sensing area is used.

FIG. 4 is a perspective view illustrating a state where a large sensor sensing area is used. A sensor sensing area 32 illustrated in FIG. 4 is unidirectionally long. The sensor sensing area 32 moves in a direction perpendicular to the longitudinal direction of the sensor sensing area 32 in a state where the rotary sample stage 35 has rotated to the predetermined angle, thus passing over the inspection object 50.

A typical distribution analyzing system A (not illustrated) measures a field at each of plural positions through which the sensor sensing area 32 passes. At that time, the distribution analyzing system A measures a field sensed by the entire sensor sensing area 32 (a field sensed by the entire sensor sensing area 32 as an aggregate).

The above measurement allows the distribution analyzing system A to obtain, with high resolution, a change in the field in the direction in which the sensor sensing area 32 advances. However, the distribution analyzing system A can hardly obtain a change in the field in a direction perpendicular to the direction in which the sensor sensing area 32 advances. The distribution analyzing system A rotates the rotary sample stage 35, and measures the field in another direction.

Specifically, the sensor sensing area 32 passes over the inspection object 50 in a state where the rotary sample stage 35 has rotated to another angle. The distribution analyzing system A measures the field at each of plural positions through which the sensor sensing area 32 passes, in the same manner as the measurement at the previous angle.

The distribution analyzing system A repeats the above procedure. Specifically, the distribution analyzing system A rotates the rotary sample stage 35 to plural angles, and moves the sensor sensing area 32. Then, the distribution analyzing system A measures a field at each of the plural positions through which the sensor sensing area 32 passes. In this manner, the distribution analyzing system A can obtain a change in the field with high resolution, in each of plural directions corresponding to the plural angles.

Figure 5:
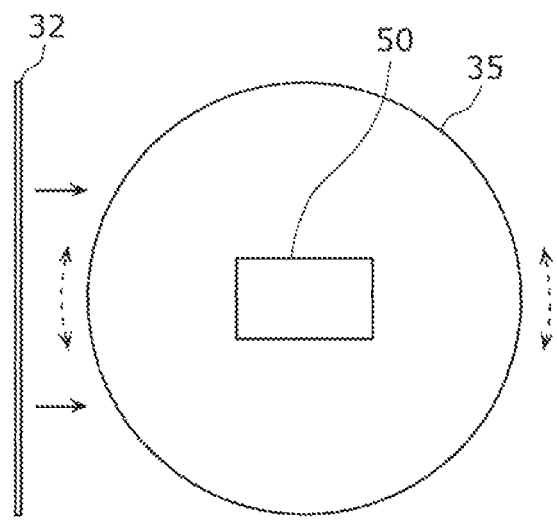
FIG. 5 is a top view illustrating the state where the large sensor sensing area is used.

FIG. 5 is a top view illustrating a state where the sensor sensing area 32 illustrated in FIG. 4 is used. As described above, the sensor sensing area 32 moves in a direction perpendicular to the longitudinal direction of the sensor sensing area 32, each time the rotary sample stage 35 has rotated to one of plural angles.

Figure 6:
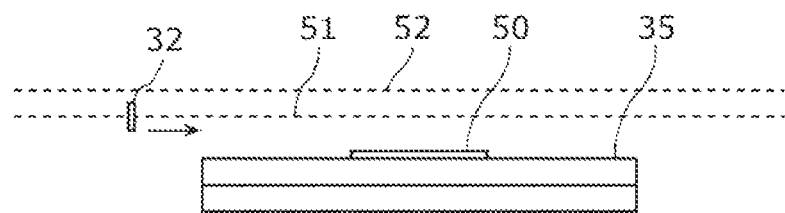
FIG. 6 is a side view illustrating the state where the large sensor sensing area is used.

FIG. 6 is a side view illustrating the state where the sensor sensing area 32 illustrated in FIG. 4 is used. The sensor sensing area 32 moves along a measurement plane 51 above the inspection object 50 placed on the rotary sample stage 35. This allows measurement of a field along the measurement plane 51. Further, the distribution analyzing system A measures a perpendicular change (gradient) in the field with respect to the measurement plane 51, and thus also measures the field at another measurement plane 52 parallel to the measurement plane 51.

The distribution analyzing system A can obtain, with high resolution, a change in the field from measurement data of the field measured following the above procedure. The above procedure, however, does not allow the distribution analyzing system A to obtain sufficient information from the sensor sensing area 32 if the inspection object 50 is larger than the sensor sensing area 32, and thus the distribution analyzing system A cannot appropriately analyze the distribution of the field.

On the other hand, if the inspection object 50 is much smaller than the sensor sensing area 32, wasteful signal processing increases, and, thus the distribution analyzing system A cannot efficiently analyze the distribution. Furthermore, the size of the sensor sensing area 32 is limited due to manufacturing limitations. In view of this, a method of obtaining data may be adopted which is achieved by repeatedly measuring a field using a small sensor sensing area while changing the position thereof, thus obtaining data equivalent to that obtained when the field is measured using a large sensor sensing area.

Figure 7:
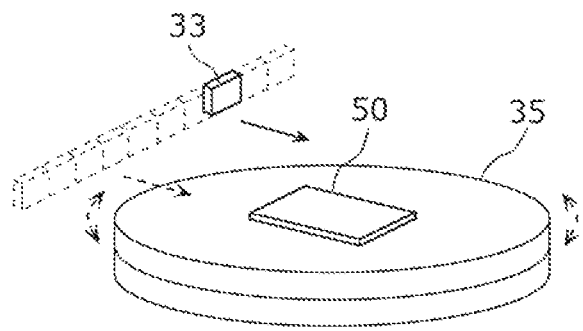
FIG. 7 is a perspective view illustrating a state where a small sensor sensing area is used.

FIG. 7 is a perspective view illustrating a state where a small sensor sensing area is used. A sensor sensing area 33 illustrated in FIG. 7 is shorter than the sensor sensing area 32 illustrated in FIG. 4. The sensor sensing area 33 passes over the inspection object 50 by moving in a state where the rotary sample stage 35 has rotated to a predetermined angle, as with the sensor sensing area 32 illustrated in FIG. 4.

The sensor sensing area 3 shifts a starting position for movement, and moves in the same direction. The typical distribution analyzing system A aggregates data of a field sensed by the sensor sensing area 33 at plural positions included in an area corresponding to the sensor sensing area 32. In this manner, the distribution analyzing system A can obtain, from the sensor sensing area 33, measurement data equivalent to measurement data obtained through the sensor sensing area 32.

The distribution analyzing system A calculates a distribution of the field using a calculation formula the same as the formula for when the sensor sensing area 32 is used. In this manner, the distribution analyzing system A can obtain, with high resolution, a change in the field in each of plural directions, as with the case where the sensor sensing area 32 is used.

Figure 8:
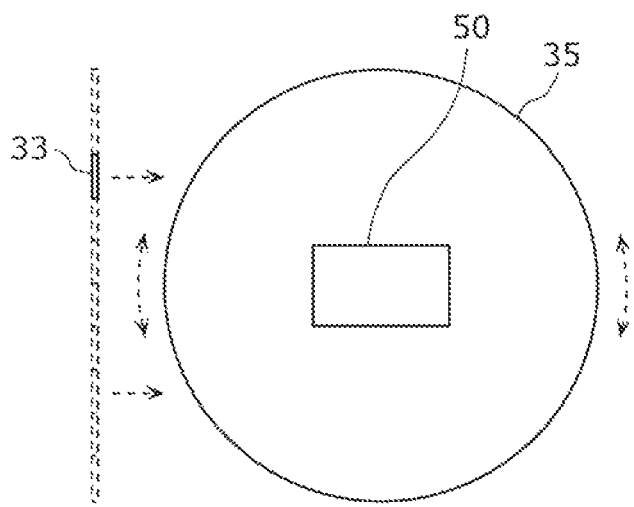
FIG. 8 is a top view illustrating the state where the small sensor sensing area is used.

FIG. 8 is a top view illustrating a state where the sensor sensing area 33 illustrated in FIG. 7 is used. As described above, the sensor sensing area 33 moves in a direction perpendicular to the surface of the sensor sensing area 33 each time the rotary sample stage 35 has rotated to one of plural angels. Then, the sensor sensing area 33 shifts the starting position for movement, and moves in the same direction.

Figure 9:
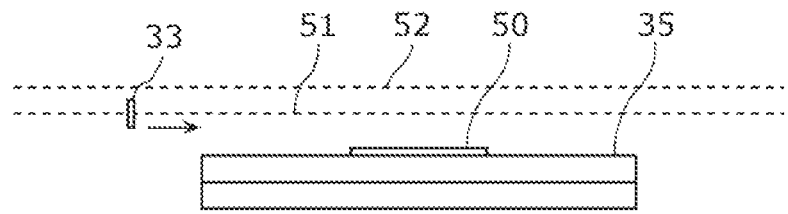
FIG. 9 is a side view illustrating the state where the small sensor sensing area is used.

FIG. 9 is a side view illustrating a state where the sensor sensing area 33 illustrated with FIG. 7 is used. The sensor sensing area 33 moves along the measurement plane 51 as with the sensor sensing area 32 illustrated in FIG. 6. The distribution analyzing system A also measures the field at the measurement plane 52 in order to measure a perpendicular change in the field with respect to the measurement plane 51.

The distribution, analyzing system A can obtain, with high resolution, a change in the field from measurement data of the field measured following the above procedure. Further, the distribution analyzing system A can appropriately analyze a distribution of the field even if the inspection object 50 is larger than the sensor sensing area 33.

On the other hand, the sensor sensing area 33 repeatedly moves, and obtains data which the sensor sensing area 32 obtains by moving one time. Accordingly, the sensor sensing area 33 takes long time to obtain data. For example, the size of the sensor sensing area 33 is $\frac{1}{10}$ of the size of the sensor sensing area 32, as illustrated in FIG. 7. Thus, data obtained by the sensor sensing area 32 through one movement is obtained by the sensor sensing area 33 through ten movements.

In other words, if the sensor sensing area 33 is used, it takes 10 times as much time to obtain data as when the sensor sensing area 32 is used. Suppose that the size of the sensor sensing area 33 is $\frac{1}{100}$ of the size of the sensor sensing area 32, the sensor sensing area 33 takes 100 times as much time as the sensor sensing area 32. This means that the sensor sensing area 33 takes 1000 seconds to obtain data which the sensor sensing area 32 obtains in 10 seconds.

In view of this, the distribution analyzing system 10 according to the present embodiment moves the sensor sensing area as illustrated in FIGS. 7 to 9, and analyzes a distribution of a field following a procedure different from that used by the typical distribution analyzing system A. In particular, the distribution analyzing system 10 appropriately analyzes a distribution with a small sensor sensing area, taking as much time as when a large sensor sensing area is used. The following describes a procedure in detail with reference to FIGS. 10 to 12.

Figure 10:
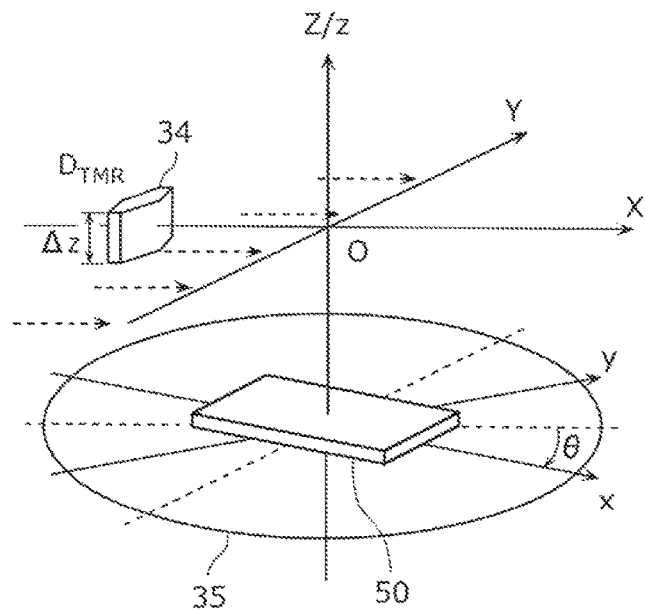
FIG. 10 illustrates movement of a sensor sensing area according to Embodiment 1.

FIG. 10 illustrates movement of the sensor sensing area of the distribution analyzing system 10 illustrated in FIG. 1. A sensor sensing area 34 illustrated in FIG. 10 corresponds to the sensor sensing area 31 of the distribution analyzing system 10 illustrated in FIG. 1. Specifically, the measurement device 30 of the distribution analyzing system 10 has the sensor sensing area 34 as the sensor sensing area 31 illustrated in FIG. 1. The size of the sensor sensing area 34 in the Z axis direction is $\Delta z$, and an area parallel to the XY plane of the sensor sensing area 34 is represented by $D_{TMR}$.

In FIG. 10, an X-axis, a Y-axis, and a Z-axis indicate coordinate axes of a stationary coordinate system, and (X, Y, Z) indicates coordinates (value) of the stationary coordinate system. An x-axis, a y-axis, and a z-axis indicate coordinate axes of a rotating coordinate system, and (x, y, z) indicates coordinates (value) of the rotating coordinate system. The rotation axis of the rotating coordinate system is the Z-axis. The Z-axis of the stationary coordinate system is the same as the maxis of the rotating coordinate system, and the relationship Z=z holds. A measurement plane is an XY plane at Z=0.

In FIG. 10, the rotation angle of the rotary sample stage 35 is $-\theta$. Specifically, the rotating coordinate system rotates to an angle of $-\theta$ with respect to the stationary coordinate system. On the contrary, the stationary coordinate system can be expressed as rotating to an angle of $\theta$ with respect to the rotating coordinate system.

Figure 11:
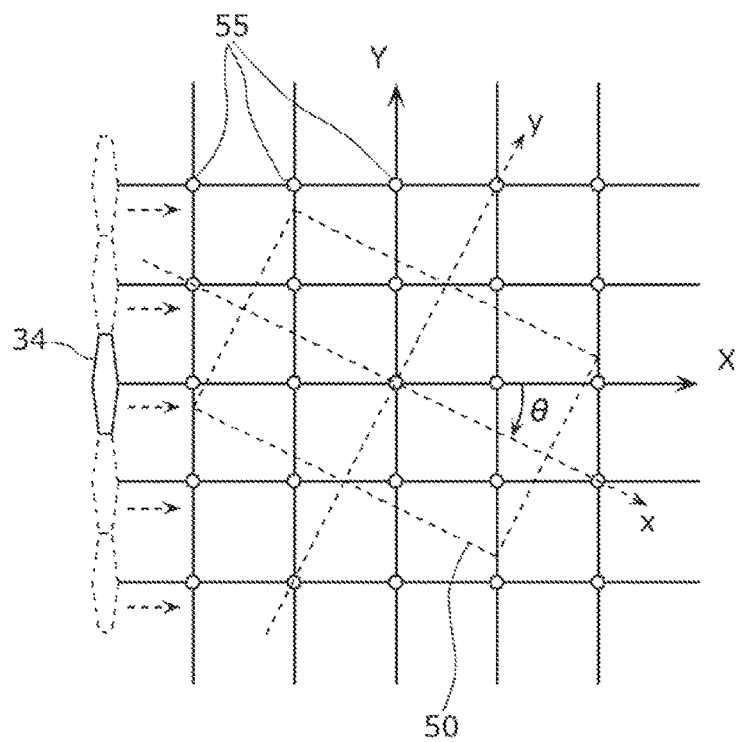
FIG. 11 is a top view illustrating the movement of the sensor sensing area according to Embodiment 1.

FIG. 11 is a top view illustrating movement of the sensor sensing area 34 illustrated in FIG. 10. The sensor sensing area 34 moves such that a predetermined position in the sensor sensing area 34 is brought to each of grid coordinate positions 55 on a measurement plane. Here, the predetermined position in the sensor sensing area 34 is a center position of the sensor sensing area 34, but may be at an edge position of the sensor sensing area 34. Furthermore, although FIG. 11 illustrates the coordinate positions 55 forming a square lattice, the coordinate positions 55 may form another type of lattice.

Figure 12:
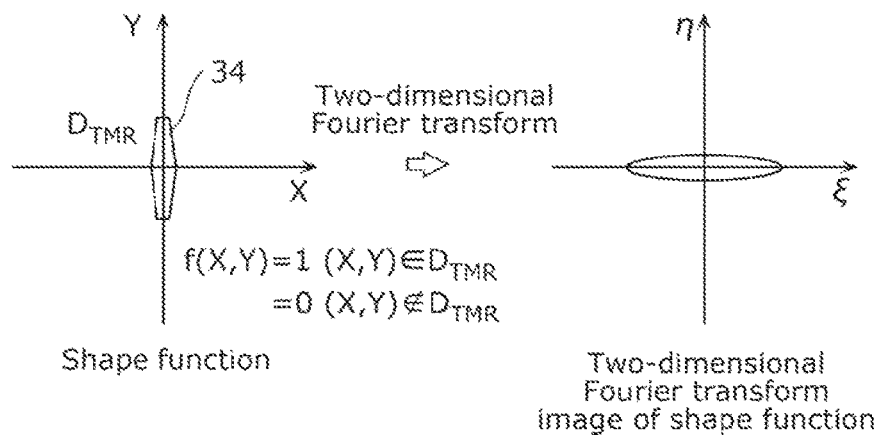
FIG. 12 illustrates a shape function according to Embodiment 1.

FIG. 12 illustrates a shape function of the sensor sensing area 34 illustrated in FIG. 10. Specifically, the shape function indicates the shape of a cross section of the finite sensor sensing area 34 along a plane parallel to the measurement plane. In other words, the shape function indicates the shape of a finite crossing area where the sensor sensing area 34 and a plane parallel to the measurement plane cross. For example, as illustrated, in FIG. 12, a shape function f (X, Y) is represented by Expression 2.

[Math. 11]

$$f(X, Y) = 1 \ (X, Y) \in D_{TMR}$$
$$= 0 \ (X, Y) \notin D_{TMR} \quad \text{Expression 2}$$

As shown by Expression 2, if coordinates (X, Y) are included in $D_{TMR}$, the shape function f(X, Y) is 1. If the coordinates (X, Y) are not included in $D_{TMR}$, the shape function f(X, Y) is 0.

FIG. 12 further illustrates a two-dimensional Fourier transform image obtained by performing a Fourier transform, on the shape function f(X, Y), in the X and Y directions. Here, ξ denotes a wavenumber in the X direction, and η denotes a wavenumber in the Y direction.

If a two-dimensional Fourier transform is performed on the shape function f(X, Y) indicating a shape that is large in the Y direction and small in the X direction as illustrated in FIG. 12, a Fourier transform image is obtained which has a wavenumber domain large in the X direction and a wavenumber domain small in the Y direction. Such a Fourier transform image shows that the resolution in the Y direction is low, whereas the resolution in the X direction is high.

In the environment illustrated in FIGS. 10 to 12, a magnetic field H is defined by Expression 3, using a component $H_x$ of the magnetic field in the x direction, a component $H_y$ of the magnetic field in the y direction, and a component $H_z$ of the magnetic field in the z direction.

[Math. 12]

$$H = (H_x, H_y, H_z) \quad \text{Expression 3}$$

Here, a focus is given on a component $H_z$ of the magnetic field in the z direction, to avoid making the description complicated. The Z component $H_z$ of the magnetic field vector can be replaced as indicated by Expression 4, using $\rho_0$ which indicates a magnetic field in the rotating coordinate system and coordinates (x, y, z) in the rotating coordinate system. It should be noted that the magnetic field $\rho_0$ may be referred to as a target harmonic function.

[Math. 13]

$$\rho_0(x,y,z) = H_z(x,y,z) \quad \text{Expression 4}$$

Expression 5 represents coordinate transformation when the rotating coordinate system rotates to an angle of −θ, using coordinates (x, y, z) of the rotating coordinate system and coordinates (X, Y, Z) of the stationary coordinate system.

[Math. 14]

$$X = x \cos θ − y \sin θ$$

$$Y = x \sin θ + y \cos θ$$

$$x = X \cos θ + Y \sin θ$$

$$y = −X \sin θ + Y \cos θ \quad \text{Expression 5}$$

The transformation from the coordinates (X, Y, Z) of the stationary coordinate system to the coordinates (x, y, z) of the rotating coordinate system when the rotation angle is θ is based on Expression 5. Accordingly, the transformation from $\rho_θ$ indicating the magnetic field of the stationary coordinate system to $\rho_0$ indicating a magnetic field of the rotating coordinate system when the rotation angle is θ is represented as shown by Expression 6.

[Math. 15]

$$\rho_θ(X, Y, Z) = \rho_0(x, y, z) \quad \text{Expression 6}$$
$$= \rho_0(X\cos θ + Y\sin θ, −X\sin θ + Y\cos θ, Z)$$

Expression 7 represents a function $\phi_θ$ obtained by the convolution of a magnetic field $\rho_θ$ and the shape function f of the sensor sensing area 34 illustrated in FIG. 12,

[Math. 16]

$$\phi_θ(X, Y, Z) = \iint_G f(u, v)\rho_θ(X + u, Y + v, Z) du dv \quad \text{Expression 7}$$

In Expression 7, G denotes an XY plane. The function $\phi_θ$ corresponds to a magnetic field sensed by the area $D_{TMR}$ which is a cross section of the sensor sensing area 34 at the measurement plane. Here, the function $\phi_θ$ may be referred to as a provisional harmonic function. A magnetic field $\phi_θ$ sensed by the sensor sensing area 34 is obtained by integrating the function $\phi_θ$ using Δz as an integration interval. In other words, the magnetic field $\phi_θ$ sensed by the sensor sensing area 34 is represented by Expression 8.

[Math. 17]

$$\Phi_θ(X, Y, Z) = \int_{-Δz/2+z}^{Δz/2+z} \phi_0(X, Y, w) dw \quad \text{Expression 8}$$
$$= \int_{-Δz/2+z}^{Δz/2+z} \left\{ \iint_G f(u, v)\rho_θ\begin{pmatrix} X+u, \\ Y+v, w \end{pmatrix} du dv \right\} dw$$

For example, the distribution analyzing system 10 measures a magnetic field at plural coordinate positions on the measurement plane, thus obtaining the magnetic field $\phi_θ$(X, Y 0). Furthermore, the distribution analyzing system 10 measures the magnetic field at another measurement plane, thus obtaining a magnetic field gradient $\nabla_z \phi_\theta(X, Y, 0)$ of the measurement plane in the normal line direction.

The function $\phi_\theta$ is an integral of multiplication of the magnetic field $\rho_\theta$ satisfying the Laplace equation and the shape function f, and thus the function $\phi_\theta$ satisfies the Laplace equation. Accordingly, the function $\theta_\theta$ satisfies Expression 9.

[Math. 18]

$$\nabla \phi_\theta(X, Y, Z) = 0 \qquad \text{Expression 9}$$

Expression 10 is obtained by performing a Fourier transform in the X and Y directions on Expression 9 above.

[Math. 19]

$$\tilde{\phi}_\theta(\xi, \eta, Z) = \iint e^{i\xi X + i\eta Y} \phi_\theta(X, Y, Z) dX dY \qquad \text{Expression 10}$$

$\xi$ denotes the wavenumber in the X direction as described above. $\eta$ denotes the wavenumber in the Y direction. Expression 11 is obtained by transforming Expression 10.

[Math. 20]

$$\left( \frac{d^2}{dZ^2} - \xi^2 - \eta^2 \right) \tilde{\phi}_\theta(\xi, \eta, Z) = 0 \qquad \text{Expression 11}$$

Expression 11 is a two-dimensional differential equation, and thus a general solution of Expression 11 is represented by Expression 12, using an unknown function $a(\xi, \eta)$ and an unknown function $b(\xi, \eta)$.

[Math. 21]

$$\tilde{\phi}_\theta(\xi, \eta, Z) = a(\xi, \eta) e^{-Z\sqrt{\xi^2 + \eta^2}} + b(\xi, \eta) e^{Z\sqrt{\xi^2 + \eta^2}} \qquad \text{Expression 12}$$

Expression 13 is obtained by performing a Fourier transform in the X and Y directions on the magnetic field $\phi_\theta$ sensed by the sensor sensing area 34,

[Math. 22]

$$\tilde{\Phi}_\theta(\xi, \eta, Z) = \int_{-\Delta z/2 + Z}^{\Delta z/2 + Z} \tilde{\phi}_\theta(\xi, \eta, w) dw \qquad \text{Expression 13}$$

$$= \frac{2\sinh\left(\frac{\Delta z \sqrt{\xi^2 + \eta^2}}{2}\right)}{\sqrt{\xi^2 + \eta^2}} \left( a(\xi, \eta) e^{-Z\sqrt{\xi^2 + \eta^2}} + b(\xi, \eta) e^{Z\sqrt{\xi^2 + \eta^2}} \right)$$

Accordingly, if functions obtained by performing a Fourier transform in the X and Y directions on the magnetic field $\phi_\theta$ and the differentiation thereof in the Z direction are represented by the following Math. 23, respectively, the function $a(\xi, \eta)$ and the function $b(\xi, \eta)$ are obtained as shown by Expression 14.

[Math. 23]

$$\tilde{\Phi}_\theta(\xi, \eta, Z), \nabla_z \tilde{\Phi}_\theta(\xi, \eta, Z)$$

[Math. 24]

$$a(\xi, \eta) = \frac{\sqrt{\xi^2 + \eta^2} \tilde{\Phi}_\theta(\xi, \eta, 0) - \nabla_z \tilde{\Phi}_\theta(\xi, \eta, 0)}{4\sinh\left(\frac{\Delta z \sqrt{\xi^2 + \eta^2}}{2}\right)} \qquad \text{Expression 14}$$

$$b(\xi, \eta) = \frac{\sqrt{\xi^2 + \eta^2} \tilde{\Phi}_\theta(\xi, \eta, 0) - \nabla_z \tilde{\Phi}_\theta(\xi, \eta, 0)}{4\sinh\left(\frac{\Delta z \sqrt{\xi^2 + \eta^2}}{2}\right)}$$

Thus, Expression obtained by substituting the function $a(\xi, \eta)$ and the function $b(\xi, \eta)$ in Expression 14 for the function $a(\iota, \eta)$ and the function $b(\xi, \eta)$ in Expression 12,

[Math. 25]

$$\tilde{\phi}_\theta(\xi, \eta, Z) = \frac{\sqrt{\xi^2 + \eta^2} \tilde{\Phi}_\theta(\xi, \eta, 0)\cosh\left(z\sqrt{\xi^2 + \eta^2}\right) + \nabla_z \tilde{\Phi}_\theta(\xi, \eta, 0)\sinh\left(z\sqrt{\xi^2 + \eta^2}\right)}{2\sinh\left(\frac{\Delta z \sqrt{\xi^2 + \eta^2}}{2}\right)} \qquad \text{Expression 15}$$

In other words, the function $\phi_\theta$ is obtained by solving the Laplace equation using a boundary condition that an integral of a solution of the Laplace equation over an interval corresponding to the size $\Delta z$ of the sensor sensing area 34 matches measurement data.

On the other hand, a two-dimensional Fourier transform in the X and Y directions is performed on both sides of Expression 7, thus obtaining Expression 16. It should be noted that in Expression 16, $\rho_\theta$ is transformed into $\rho_0$, based on Expression 6.

[Math. 26]

$$\tilde{\phi}_\theta(\xi, \eta, Z) = \iint e^{i\xi X + i\eta Y} \left\{ \iint_G f(u, v) \rho_\theta(X + u, Y + v, Z) du dv \right\} dX dY \qquad \text{Expression 16}$$

$$= \tilde{f}(\xi, \eta)^* \iint_G e^{i\xi X + i\eta Y} \rho_0(X\cos\theta + Y\sin\theta, -X\sin\theta + Y\cos\theta, Z) dX dY$$

Here, * denotes a complex conjugate. Expression 16 above is represented as shown by Expression 17, based on Expression 5,

[Math. 27]

$$\tilde{\phi}_\theta(\xi, \eta, Z) = \tilde{f}(\xi, \eta)^* \iint_G e^{i\xi(X\cos\theta - Y\sin\theta) + i\eta(X\sin\theta + Y\cos\theta)} \rho_0(X, Y, Z) dX dY \qquad \text{Expression 17}$$

$$= \tilde{f}(\xi, \eta)^* \tilde{\rho}_0(\xi\cos\theta + \eta\sin\theta, -\xi\sin\theta + \eta\cos\theta, Z)$$

Furthermore, the relationship among a wavenumber $k_x$ of the rotating coordinate system in the x direction, a wavenumber $k_y$ of the rotating coordinate system in the y direction, a wavenumber $\xi$ of the stationary coordinate system in the X direction, and a wavenumber $\eta$ of the stationary coordinate system in the Y direction satisfies Expression 18.

[Math. 28]

$$k_x = \xi \cos\theta + \eta \sin\theta$$

$$k_y = -\xi \sin\theta + \eta \cos\theta \qquad \text{Expression 18}$$

Accordingly, Expression 17 is replaced as shown by Expression 19, using the wavenumber $k_x$ of the rotating coordinate system in the x direction and the wavenumber $k_y$ of the rotating coordinate system in the y direction.

[Math. 29]

$$\tilde{\phi}_\theta(k_x \cos\theta - k_y \sin\theta, k_x \sin\theta + k_y \cos\theta, z) = \tilde{f}(k_x \cos\theta - k_y \sin\theta, k_x \sin\theta + k_y \cos\theta) * \rho_0(k_x, k_y, z) \qquad \text{Expression 19}$$

Both sides of Expression 19 are multiplied by $$\tilde{f}(k_x \cos\theta - k_y \sin\theta, k_x \sin\theta + k_y \cos\theta) \qquad \text{[Math. 30]}$$

and integrated over $\theta$, thus obtaining a Fourier transform image of the magnetic field $\rho_0$ as shown by Expression 20,

[Math. 31]

$$\tilde{\rho}_0(k_x, k_y, z) = \frac{\int \tilde{f}(k_x\cos\theta - k_y\sin\theta, k_x\sin\theta + k_y\cos\theta)\tilde{\phi}_\theta(k_x\cos\theta - k_y\sin\theta, k_x\sin\theta + k_y\cos\theta, z)d\theta}{\int |\tilde{f}(k_x\cos\theta - k_y\sin\theta, k_x\sin\theta + k_y\cos\theta)|^2 d\theta} \qquad \text{Expression 20}$$

The denominator of Expression 20 is obtained by integrating, over $\theta$, the square of the absolute value of the shape function f on which a two-dimensional Fourier transform is performed. The denominator of Expression 20 is a non-zero value even in the case of a high frequency having a wavelength of about 20 to 50 nm in a typical normal TMR sensor.

Expression 20 includes multiplication of a Fourier transform image of the shape function f and a Fourier transform image of the function $\phi_\theta$. In other words, a distribution of a magnetic field is calculated based on a resolution corresponding to the shape of the sensor sensing area 34, by multiplying the Fourier transform image of the function $\phi_\theta$ by the Fourier transform image of the shape function f. Accordingly, the error according to the shape of the sensor sensing area 34 is eliminated.

Expression 20 includes integrating, over a rotation angle $\theta$, multiplication of the Fourier transform image of the shape function f and the Fourier transform image of the function $\phi_\theta$. Accordingly, measurement data obtained at each rotation angle is reflected in the calculation of the distribution.

For example, the calculation unit 22 of the distribution analyzing device 20 calculates a distribution of a magnetic field using Expression 20. Expression 20 includes information on a rotation angle. Furthermore, a Fourier transform image of $\phi_\theta$ included in Expression 20 is derived from measurement data of a field measured at each of grid coordinate positions. In other words, the Fourier transform image of $\phi_\theta$ includes information on a coordinate position. The calculation unit 22 appropriately uses information on a rotation angle and information on a coordinate position using Expression 20, without wastefully using such information pieces.

Accordingly, even if a small number of measurements are made, or in other words, if a small number of rotations is made the number of plural rotation angles is few), or even if there are few coordinate positions at which measurement is performed, the distribution analyzing device 20 can calculate an appropriate distribution from measurement data. Accordingly, the distribution analyzing device 20 can analyze a distribution of a magnetic field at high speed.

Lastly. Expression 21 indicating the magnetic, field $\rho_0$ is obtained by performing a two-dimensional inverse Fourier transform on Expression 20.

[Math. 32]

$$H_z(x, y, z) = \rho_0(x, y, z) = \frac{1}{(2\pi)^2} \int\int e^{-ixk_x - iyk_y} \tilde{\rho}_0(k_x, k_y, z) dk_x dk_y \qquad \text{Expression 21}$$

For example, if the inspection object 50 is placed along $z = z_0$, the calculation unit 22 of the distribution analyzing device 20 substitutes $z_0$ for z in Expression 21, thus calculating a distribution of a magnetic field at the cross section of the inspection object 50.

It should be noted that a two-dimensional Fourier transform image of the magnetic field $\rho_x$ corresponding to the x component H of the magnetic field H is obtained by the same as the above. Expression 22 indicates a two-dimensional Fourier transform image of the magnetic field $\rho_x$.

[Math. 33]

$$\tilde{\rho}_x(k_x, k_y, z) = \frac{-\int \tilde{f}(k_x\cos\theta - k_y\sin\theta, k_x\sin\theta + k_y\cos\theta)\tilde{\phi}_\theta(k_x\cos\theta - k_y\sin\theta, k_x\sin\theta + k_y\cos\theta, z)\sin\theta d\theta}{\int |\tilde{f}(k_x\cos\theta - k_y\sin\theta, k_x\sin\theta + k_y\cos\theta)|^2 \sin^2\theta d\theta} \qquad \text{Expression 22}$$

A two-dimensional inverse Fourier transform is performed on Expression 22, thus obtaining the magnetic field $\rho_x$ as shown by Expression 23.

[Math. 34]

$$H_x(x, y, z) = \rho_x(x, y, z) = \frac{1}{(2\pi)^2} \int\int e^{-ixk_x - iyk_y} \tilde{\rho}_x(k_x, k_y, z) dk_x dk_y \qquad \text{Expression 23}$$

Furthermore, a two-dimensional Fourier transform image of a magnetic field $\rho_y$ corresponding to a y component $H_y$ of the magnetic field H is obtained in a similar manner. Expression 24 shows a two-dimensional Fourier transform image of the magnetic field $\rho_y$.

[Math. 35]

$$\tilde{p}_y(k_x, k_y, z) = \frac{\int \tilde{f}(k_x\cos\theta - k_y\sin\theta, k_x\sin\theta + k_y\cos\theta)\tilde{\phi}_\theta(k_x\cos\theta - k_y\sin\theta, k_x\sin\theta + k_y\cos\theta, z)\cos\theta d\theta}{\int |\tilde{f}(k_x\cos\theta - k_y\sin\theta, k_x\sin\theta + k_y\cos\theta)|^2\cos^2\theta d\theta}$$

Expression 24

The magnetic field p is obtained as shown by Expression 25, by performing a two-dimensional inverse Fourier transform on Expression 24.

[Math. 36]

$$H_y(x, y, z) = \rho_y(x, y, z) = \frac{1}{(2\pi)^2}\int\int e^{-ixk_x - iyk_y}\tilde{p}_y(k_x, k_y, z)dk_x dk_y$$

Expression 25

As described above, the distribution analyzing device 20 according to the present embodiment eliminates error according to the shape of a sensor sensing area using a shape function, thus calculating a distribution using both the rotation angle and a coordinate position of the sensor sensing area. Accordingly, the distribution analyzing device 20 can calculate an appropriate distribution even if few measurements are made. In other words, the distribution analyzing device 20 can analyze the distribution at high speed.

It should be noted that the above arithmetic expressions and the above procedures of deriving the arithmetic expressions are examples, and other arithmetic expressions and derivation procedures may be used. Using the arithmetic expressions derived from a combination of the shape function and the Laplace equation, the distribution analyzing device 20 can appropriately calculate a distribution of a field from measurement data of the field measured at each rotation angle and at each coordinate position.

Furthermore, a comparatively small inspection object is shown in the present embodiment. However, even if an inspection object is comparatively large, like when the inside of concrete is examined, for instance, the distribution analyzing device 20 according to the present embodiment can appropriately calculate a distribution based on measurement data and a shape function. Also in such a case, highly advantageous effects can be achieved which allow calculation of an appropriate distribution with a small sensor through few measurements.

Embodiment 2

Figure 13:
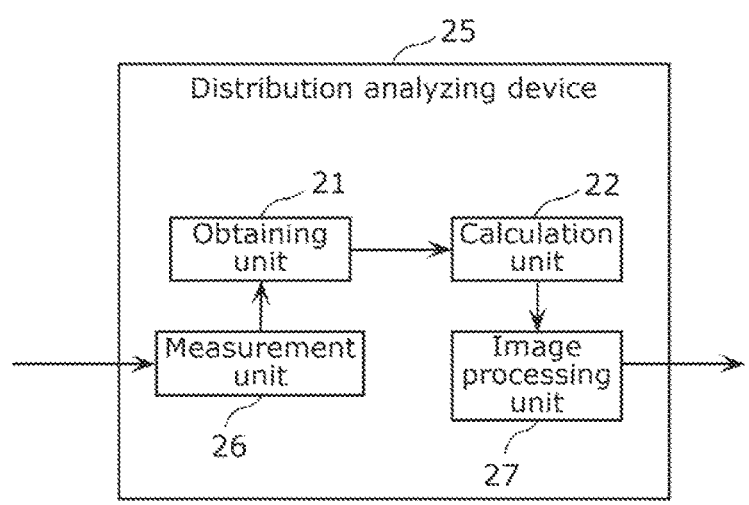
FIG. 13 is a configuration diagram of a distribution analyzing device according to Embodiment 2.

FIG. 13 is a configuration diagram of a distribution analyzing device according to the present embodiment. A distribution analyzing device 25 illustrated in FIG. 13 includes an obtaining unit 21, a calculation unit 22, a measurement unit 26, and an image processing unit 27. Specifically, the distribution analyzing device 25 according to the present embodiment includes the measurement unit 26 and the image processing unit 27 in addition to the units included in the distribution analyzing device 20 according to Embodiment 1.

The measurement unit 26 includes a sensor sensing area. Then, the measurement unit 26 measures a distribution of a field through the sensor sensing area. The obtaining unit 21 obtains measurement data from the measurement unit 26. For example, the measurement unit 26 includes a sensor or a probe, for instance. The measurement unit 26 may be the measurement device 30 according to Embodiment 1. Then, the measurement unit 26 may perform equivalent operation to the operation performed by the measurement device 30.

The image processing unit 27 generates an image corresponding to a distribution calculated by the calculation unit 22. The generated image is displayed on an external display device, for instance. It should be noted that the distribution analyzing device 25 may include a display unit which displays the generated image.

Figure 14:
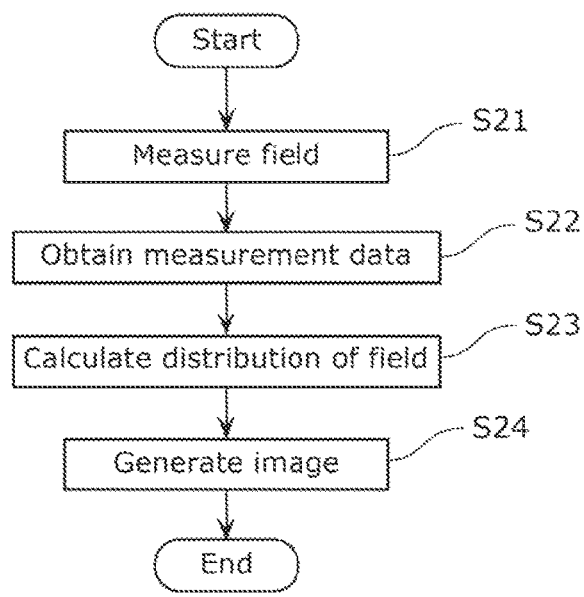
FIG. 14 is a flowchart illustrating operation of the distribution analyzing device according to Embodiment 2.

FIG. 14 is a flowchart illustrating operation of the distribution analyzing device 25 illustrated in FIG. 13. First, the measurement unit 26 measures a distribution of a field through a sensor sensing area (S21). Next, the obtaining unit 21 obtains measurement data of the field measured by the measurement unit 26 (S22). Next, the calculation unit 22 calculates a distribution of the field from the measurement data (S23). At this time, the calculation unit 22 uses the arithmetic expressions described in Embodiment 1. Then, the image processing unit 27 generates an image using the calculated distribution (S24).

As described above, the distribution analyzing device 25 according to the present embodiment includes the measurement unit 26 and the image processing unit 27 in addition to the units included in the distribution analyzing device 20 according to Embodiment 1. Conversely, the distribution analyzing device 20 according to Embodiment 1 does not need to include the measurement unit 26 and the image processing unit 27, for instance. The distribution analyzing device 20 may obtain measurement data of the field from an external measurement device, and may output information on the distribution of the field to an external image processing device.

Although the above is a description of the distribution analyzing device according to the present invention based on plural embodiments, the present invention is not limited to those embodiments. The present invention also includes embodiments obtained by performing modification that may be conceived by those skilled in the art on the embodiments and other embodiments achieved by arbitrarily combining the constituent elements in the embodiments.

For example, a process executed by a specific process unit may be executed by a different process unit. Furthermore, the order of executing processes may be changed, and plural processes may be executed in parallel.

The present invention can be achieved not only as a distribution analyzing device, but also as a method including steps which are to use the processing units included in the distribution analyzing device. For example, those steps are executed by a computer. In addition, the present invention can be achieved as a program for causing a computer to execute the steps included in the method. Furthermore, the present invention can be achieved as a non-transitory computer-readable recording medium such as a CD-ROM in which the program is stored.

For example, if the present invention is achieved by a program (software), the functional elements of the present invention are achieved by executing the program using hardware resources, such as a CPU, a memory, and an input output circuit of a computer. In other words, the CPU obtains data to be processed from the memory or the input output circuit and computes the data, and then outputs the result of the computation to the memory or the input output circuit, thus achieving the functional elements.

Furthermore, the constituent elements included in the distribution analyzing device may be achieved as a large-scale integration (LSI) which is an integrated circuit. These constituent elements may be each formed as a single chip or may be formed as a single chip which includes some or all of the elements. Although an LSI is described here, the integrated circuit may also be called an integrated circuit (IC), a system LSI, a super LSI, or an ultra LSI, depending on a difference in the degree of integration.

Furthermore, ways to achieve the integration are not limited to the LSI, and a dedicated circuit or a general purpose processor can also achieve the integration. A field programmable gate array (FPGA) that allows programming or a reconfigurable processor that allows reconfiguration of the connections and settings of the circuit cells inside the LSI may also be used.

In addition, if the progress in semiconductor technology or other derivative technology leads to the emergence of circuit integration technology that replaces LSI, it is of course possible to use such technology to perform circuit integration of the constituent elements included in the distribution analyzing device.

INDUSTRIAL APPLICABILITY

The distribution analyzing device according to the present invention can analyze distributions of various fields, and can be used for, for example, magnetic field diagnostic equipment, electronic component inspection, concrete rebar corrosion inspection, seismic qualification testing for steel structures in earthquake-stricken regions, and medical diagnosis.

REFERENCE SIGNS LIST

10 Distribution analyzing system
20, 25 Distribution analyzing device
21 Obtaining unit
22 Calculation unit
26 Measurement unit
27 Image processing unit
30 Measurement device
31, 32, 33, 34 Sensor sensing area
35 Rotary sample stage
36 Soft layer
37 Tunneling layer
38 Pinned layer (fixed magnetic layer)
40 Display device
50 Inspection object
51, 52 Measurement plane
55 Coordinate position

The invention claimed is:

1. A distribution analyzing device for analyzing a distribution of a field having a property satisfying a Laplace equation, the distribution analyzing device comprising:
a processor; and
a non-transitory computer-readable recording medium having stored thereon executable instructions, which when executed by the processor, cause the distribution analyzing device to function as:
an obtaining unit configured to obtain measurement data of the field measured, when a sensor sensing area of a sensor passes over the field, independently at each of rotation angles of the sensor sensing area and at each of grid coordinate positions of the sensor sensing area on a measurement plane where the field is measured, the sensor sensing area being (i) a finite area which relatively rotates about an axis perpendicular to the measurement plane, (ii) an area which relatively moves such that a predetermined position in the area is brought to each of the grid coordinate positions in a state where the area has relatively rotated, and (iii) an area in which the field is sensed as an aggregate; and
a calculation unit configured to calculate the distribution of the field from the measurement data of the field, using an arithmetic expression obtained by deriving a target harmonic function, which indicates the distribution of the field, using a condition that a convolution of the target harmonic function and a shape function, which indicates a shape of a cross section of the finite sensor sensing area along a plane parallel to the measurement plane, is equal to a provisional harmonic function derived by solving the Laplace equation using the measurement data of the field and a size of the sensor sensing area in a direction perpendicular to the measurement plane,
wherein:
information on the shape of the cross section of the finite sensor sensing area along the plane parallel to the measurement plane is reflected in the calculation of the distribution of the field such that the distribution of the field is able to be analyzed using both the rotation angles of the sensor sensing area and the grid coordinate positions of the sensor sensing area, regardless of a size of the sensor,
the arithmetic expression used by the calculation unit to calculate the distribution of the field from the measurement data of the field includes division of an expression obtained by integrating, over the rotation angles, an expression including multiplication of the shape function and the provisional harmonic function, by an expression obtained by integrating, over the rotation angles, an expression including a square of an absolute value of the shape function, the shape function and the provisional harmonic function each having been subjected to a Fourier transform, and
the shape function indicating the shape of the cross section of the finite sensor sensing area along the plane parallel to the measurement plane is a function which returns 1 when a position included in the shape is given as a parameter, and returns 0 when a position not included in the shape is given as a parameter.

2. The distribution analyzing device according to claim 1, wherein the field is a magnetic field or an electric field.

3. The distribution analyzing device according to claim 1, wherein the sensor sensing area which passes over the field, thereby sensing the measurement data of the field to be obtained by the obtaining unit is measured, is an area which is caused to relatively rotate by the field rotating about the axis perpendicular to the measurement plane, and which moves to each of the grid coordinate positions that are stationary on the measurement plane.

4. The distribution analyzing device according to claim 3, wherein when (x, y, z) denotes a rotating coordinate system which rotates, (X, Y, Z) denotes a stationary coordinate system which does not rotate, θ denotes one of the rotation angles, $k_x$ denotes a wavenumber of the rotating coordinate system in an x direction, $k_y$ denotes a wavenumber of the rotating coordinate system in a y direction, ξ denotes a wavenumber of the stationary coordinate system in an X direction, η denotes a wavenumber of the stationary coordinate system in a Y direction, $$\tilde{f}(\xi,\eta) \qquad [\text{Math. 1}]$$

denotes the shape function, and $$\tilde{\phi}_\theta(\xi,\eta,z) \qquad [\text{Math. 2}]$$

denotes the provisional harmonic function, the shape function and the provisional harmonic function each having been subjected to a two-dimensional Fourier transform, the arithmetic expression used by the calculation unit to calculate the distribution of the field from the measurement data of the field is $$\frac{\int \tilde{f}(k_x\cos\theta - k_y\sin\theta, k_x\sin\theta + k_y\cos\theta)\tilde{\phi}_\theta}{\int |\tilde{f}(k_x\cos\theta - k_y\sin\theta, k_x\sin\theta + k_y\cos\theta)|^2 d\theta}. \qquad [\text{Math. 3}]$$

5. The distribution analyzing device according to claim 3, wherein when (x, y, z) denotes a rotating coordinate system which rotates, (X, Y, Z) denotes a stationary coordinate system which does not rotate, θ denotes one of the rotation angles, $k_x$ denotes a wavenumber of the rotating coordinate system in an x direction, $k_y$ denotes a wavenumber of the rotating coordinate system in a y direction, ξ denotes a wavenumber of the stationary coordinate system in an X direction, η denotes a wavenumber of the stationary coordinate system in a Y direction, $$\tilde{f}(\xi,\eta) \qquad [\text{Math. 4}]$$

denotes the shape function, and $$\tilde{\phi}_\theta(\xi,\eta,z) \qquad [\text{Math. 5}]$$

denotes the provisional harmonic function, the shape function and the provisional harmonic function each having been subjected to a two-dimensional Fourier transform, the arithmetic expression used by the calculation unit to calculate the distribution of the field from the measurement data of the field is $$\frac{-\int \tilde{f}(k_x\cos\theta - k_y\sin\theta, k_x\sin\theta + k_y\cos\theta)\tilde{\phi}_\theta}{\int |\tilde{f}(k_x\cos\theta - k_y\sin\theta, k_x\sin\theta + k_y\cos\theta)|^2 \sin^2\theta d\theta} \qquad [\text{Math. 6}]$$

which is for calculating a component of the field in the x direction.

6. The distribution analyzing device according to claim 3, wherein when (x, y, z) denotes a rotating coordinate system which rotates, (X, Y, Z) denotes a stationary coordinate system which does not rotate, θ denotes one of the rotation angles, $k_x$ denotes a wavenumber of the rotating coordinate system in an x direction, $k_y$ denotes a wavenumber of the rotating coordinate system in a y direction, ξ denotes a wavenumber of the stationary coordinate system in an X direction, η denotes a wavenumber of the stationary coordinate system in a Y direction, $$\tilde{f}(\xi,\eta) \qquad [\text{Math. 7}]$$

denotes the shape function, and $$\tilde{\phi}_\theta(\xi,\eta,z) \qquad [\text{Math. 8}]$$

denotes the provisional harmonic function, the shape function and the provisional harmonic function each having been subjected to a two-dimensional Fourier transform, the arithmetic expression used by the calculation unit to calculate the distribution of the field from the measurement data of the field is $$\frac{\int \tilde{f}(k_x\cos\theta - k_y\sin\theta, k_x\sin\theta + k_y\cos\theta)\tilde{\phi}_\theta}{\int |\tilde{f}(k_x\cos\theta - k_y\sin\theta, k_x\sin\theta + k_y\cos\theta)|^2 \cos^2\theta d\theta} \qquad [\text{Math. 9}]$$

which is for calculating a component of the field in the y direction.

7. The distribution analyzing device according to claim 1, wherein the executable instructions, when executed by the processor, further cause the distribution analyzing device to function as:
a measurement unit which includes the sensor sensing area,
wherein the measurement unit is configured to measure the field, through the sensor sensing area, independently at each of the rotation angles of the sensor sensing area and at each of the grid coordinate positions of the sensor sensing area, and
the obtaining unit is configured to obtain the measurement data of the field measured by the measurement unit.

8. The distribution analyzing device according to claim 1, wherein the executable instructions, when executed by the processor, further cause the distribution analyzing device to function as:
an image processing unit configured to generate an image which shows the distribution, using the distribution calculated by the calculation unit.

9. The distribution analyzing device according to claim 1, wherein the sensor sensing area which passes over the field, thereby sensing the measurement data of the field to be obtained by the obtaining unit is measured, is an area which relatively moves such that a central position of the sensor sensing area is brought to each of the grid coordinate positions in the state where the sensor sensing area has relatively rotated, and
the target harmonic function which is derived to obtain the arithmetic expression used by the calculation unit to calculate the distribution of the field from the measurement data of the field satisfies that a convolution of the target harmonic function and the shape function is equal to the provisional harmonic function, the shape function being defined using the central position of the sensor sensing area as a reference point.

10. The distribution analyzing device according to claim 1,
wherein the calculation unit is configured to calculate the distribution of the field from the measurement data of the field, using the arithmetic expression obtained by deriving the target harmonic function using the condition that the convolution of the target harmonic function and the shape function is equal to the provisional harmonic function obtained by solving the Laplace equation using a boundary condition that an integral of a solution of the Laplace equation over an interval corresponding to the size of the sensor sensing area in the direction perpendicular to the measurement plane matches the measurement data of the field.

11. A distribution analyzing method for analyzing a distribution of a field having a property satisfying a Laplace equation, the distribution analyzing method comprising:

causing a processor to execute executable instructions stored in a non-transitory computer-readable recording medium, thereby executing steps of:

obtaining measurement data of the field measured, when a sensor sensing area of a sensor passes over the field, independently at each of rotation angles of the sensor sensing area and at each of grid coordinate positions of the sensor sensing area on a measurement plane where the field is measured, the sensor sensing area being (i) a finite area which relatively rotates about an axis perpendicular to the measurement plane, (ii) an area which relatively moves such that a predetermined position in the area is brought to each of the grid coordinate positions in a state where the area has relatively rotated, and (iii) an area in which the field is sensed as an aggregate; and calculating the distribution of the field from the measurement data of the field, using an arithmetic expression obtained by deriving a target harmonic function, which indicates the distribution of the field, using a condition that a convolution of the target harmonic function and a shape function, which indicates a shape of a cross section of the finite sensor sensing area along a plane parallel to the measurement plane, is equal to a provisional harmonic function derived by solving the Laplace equation using the measurement data of the field and a size of the sensor sensing area in a direction perpendicular to the measurement plane, wherein:

information on the shape of the cross section of the finite sensor sensing area along the plane parallel to the measurement plane is reflected in the calculation of the distribution of the field such that the distribution of the field is able to be analyzed using both the rotation angles of the sensor sensing area and the grid coordinate positions of the sensor sensing area, regardless of a size of the sensor, the arithmetic expression used when calculating the distribution of the field from the measurement data of the field includes division of an expression obtained by integrating, over the rotation angles, an expression including multiplication of the shape function and the provisional harmonic function, by an expression obtained by integrating, over the rotation angles, an expression including a square of an absolute value of the shape function, the shape function and the provisional harmonic function each having been subjected to a Fourier transform, and the shape function indicating the shape of the cross section of the finite sensor sensing area along the plane parallel to the measurement plane is a function which returns 1 when a position included in the shape is given as a parameter, and returns 0 when a position not included in the shape is given as a parameter.

* * * * *